US009053835B2

(12) United States Patent
Takahashi et al.

(10) Patent No.: US 9,053,835 B2
(45) Date of Patent: Jun. 9, 2015

(54) FLEXIBLE CABLE AND MEDIUM PROCESSING DEVICE

(75) Inventors: Kazunori Takahashi, Nagano (JP); Toshiro Shiomi, Nagano (JP)

(73) Assignee: NIDEC SANKYO CORPORATION (JP)

( * ) Notice: Subject to any disclaimer, the term of this patent is extended or adjusted under 35 U.S.C. 154(b) by 0 days.

(21) Appl. No.: 13/876,643

(22) PCT Filed: Feb. 15, 2012

(86) PCT No.: PCT/JP2012/053446
§ 371 (c)(1),
(2), (4) Date: Mar. 28, 2013

(87) PCT Pub. No.: WO2012/127938
PCT Pub. Date: Sep. 27, 2012

(65) Prior Publication Data
US 2014/0009878 A1    Jan. 9, 2014

(30) Foreign Application Priority Data
Mar. 24, 2011  (JP) .................................. 2011-066520

(51) Int. Cl.
*G11B 17/04* (2006.01)
*H01B 7/04* (2006.01)
*G06K 19/077* (2006.01)
*H05K 1/02* (2006.01)
*H05K 1/03* (2006.01)
*G01R 31/02* (2006.01)

(52) U.S. Cl.
CPC ................ *H01B 7/04* (2013.01); *G06K 19/077* (2013.01); *G11B 17/0408* (2013.01); *H05K 1/0218* (2013.01); *H05K 1/0275* (2013.01); *H05K 1/0393* (2013.01); *G01R 31/025* (2013.01)

(58) Field of Classification Search
USPC .................... 360/245.8, 245.9; 720/618, 745; 174/113 R, 117 R, 117 F, 117 FF; 235/492, 380
See application file for complete search history.

(56) References Cited

U.S. PATENT DOCUMENTS

| 5,310,998 A * | 5/1994 | Okuno .......................... 235/380 |
| 7,699,225 B2 * | 4/2010 | Horiguchi et al. ............. 235/449 |
| 2011/0062239 A1 * | 3/2011 | Lau et al. ...................... 235/492 |
| 2013/0161086 A1 * | 6/2013 | Mayer et al. .................. 174/535 |
| 2014/0009878 A1 * | 1/2014 | Takahashi et al. ......... 361/679.4 |

FOREIGN PATENT DOCUMENTS

| JP | 2001-36202 A | 2/2001 |
| JP | 2003-99908 A | 4/2003 |
| JP | 2008-293628 A | 12/2008 |

OTHER PUBLICATIONS

International Search Report for International application No. PCT/JP2012/053446, mailed Apr. 16, 2012, with English translation.

* cited by examiner

*Primary Examiner* — Brian Miller
(74) *Attorney, Agent, or Firm* — Cantor Colburn LLP

(57) ABSTRACT

A flexible cable may include a data signal layer; a first disconnection detecting signal layer covering a front face of the data signal layer and formed with a disconnection detecting signal pattern; and a second disconnection detecting signal layer covering a rear face of the data signal layer and formed with a disconnection detecting signal pattern. The flexible cable may be formed in a multilayer structure. A shield pattern may be formed in the first and/or second disconnection detecting signal layer and avoiding the disconnection detecting signal pattern. The data signal pattern may be formed so as to be covered by the disconnection detecting signal pattern. At least a part of the signal pattern may be formed so as to avoid the disconnection detecting signal pattern.

11 Claims, 7 Drawing Sheets

FLEXIBLE CABLE AND MEDIUM PROCESSING DEVICE

CROSS REFERENCE TO RELATED APPLICATIONS

This is a U.S. national stage of International Application No. PCT/JP2012/053446, filed on Feb. 15, 2012. Priority under 35 U.S.C. §119(a) and 35 U.S.C. §365(b) is claimed from Japanese Application No. 2011-066520, the disclosure of which is also incorporated herein by reference.

TECHNICAL FIELD

The present invention relates to a flexible cable which is connected with a data input and output contact for inputting and outputting data and a plurality of contacts other than the data input and output contact. Further, the present invention relates to a medium processing device which is provided with the flexible cable.

BACKGROUND

Conventionally, a card reader which exchanges data with a contact type IC card has been utilized widely. In this type of a card reader, a flexible cable is connected with a plurality of IC contacts which are structured to contact with connecting terminals of an IC card (see, for example, Patent Literature 1). In the flexible cable described in Patent Literature 1, in order to reduce a cross talk between signals transmitted through the flexible cable, a power supply pattern, a ground pattern, a clock signal pattern and a data signal pattern are formed on one face of the flexible cable, and a shield pattern connected with the power supply pattern and the ground pattern is formed on the other face of the flexible cable.

Further, conventionally, in an industry where a card reader is utilized, illegal acquisition of data, that is, a criminal illegally acquires recorded data in a card has been a serious problem. Therefore, conventionally, a flexible cable which is capable of preventing illegal acquisition of data has been proposed (see, for example, Patent Literature 2). The flexible cable described in Patent Literature 2 is connected with signal terminals of the magnetic head. In the flexible cable, both of upper and lower faces of a signal wiring line layer in which a data signal pattern is formed through which a data signal from the magnetic head is transmitted are covered by a protective layer. The protective layer is formed with a disconnection detecting pattern having a disconnection detection function and a short circuit detecting pattern. Therefore, in the flexible cable described in Patent Literature 2, attachment of a signal line for data illegal acquisition to the data signal pattern can be prevented and, as a result, illegal acquisition of data from the flexible cable can be prevented.

Patent Literature

[PTL 1] Japanese Patent Laid-Open No. 2001-36202
[PTL 2] Japanese Patent Laid-Open No. 2008-293628

As described above, in the flexible cable described in Patent Literature 1, a cross talk between signals transmitted through the flexible cable can be reduced. However, in the flexible cable, it is difficult to prevent illegal acquisition of data from the flexible cable. On the other hand, in the flexible cable described in Patent Literature 2, illegal acquisition of data from the flexible cable can be prevented. However, in a case that the flexible cable is used in a card reader for an IC card, a cross talk is increased under influence of the disconnection detecting pattern and the short circuit detecting pattern.

SUMMARY

In view of the problem described above, at least an embodiment of the present invention provides a flexible cable which is capable of attaining both of prevention of illegal acquisition of data and reduction of the cross talk. Further, at least an embodiment of the present invention provides a medium processing device which is provided with the flexible cable.

In order to solve the above problem, at least an embodiment of the present invention provides a flexible cable which is connected with a data input and output contact for performing data input and/or data output and a plurality of contacts other than the data input and output contact. The flexible cable includes a data signal layer which is formed with a data signal pattern connected with the data input and output contact and a plurality of signal patterns connected with a plurality of the contacts, a first disconnection detecting signal layer which covers a front face of the data signal layer and is formed with a disconnection detecting signal pattern transmitting a disconnection detecting signal for detecting its own disconnection, and a second disconnection detecting signal layer which covers a rear face of the data signal layer and is formed with a disconnection detecting signal pattern transmitting a disconnection detecting signal for detecting its own disconnection. The flexible cable is formed in a multilayer structure including the data signal layer, the first disconnection detecting signal layer and the second disconnection detecting signal layer. In addition, a shield pattern is formed in the first disconnection detecting signal layer and/or the second disconnection detecting signal layer at a position avoiding the disconnection detecting signal pattern, and the data signal pattern is formed so as to be covered by the disconnection detecting signal pattern of the first disconnection detecting signal layer and the disconnection detecting signal pattern of the second disconnection detecting signal layer, and at least a part of the signal pattern is formed so as to avoid the disconnection detecting signal pattern(s) of the first disconnection detecting signal layer and/or the second disconnection detecting signal layer in which the shield pattern is formed.

In the flexible cable in accordance with at least an embodiment of the present invention, the data signal pattern which is connected with the data input and output contact is formed so as to be covered by the disconnection detecting signal pattern of the first disconnection detecting signal layer and the disconnection detecting signal pattern of the second disconnection detecting signal layer. Therefore, when a criminal is trying to attach a signal line for data illegal acquisition to the data signal pattern, the criminal act is detected by utilizing the disconnection detecting signal pattern. Accordingly, in at least an embodiment of the present invention, attachment of a signal line for data illegal acquisition to the data signal pattern is prevented and, as a result, illegal acquisition of data from the flexible cable is prevented.

Further, in at least an embodiment of the present invention, the shield pattern is formed in the first disconnection detecting signal layer and/or the second disconnection detecting signal layer at a position avoiding the disconnection detecting signal pattern, and at least a part of the signal pattern which is connected with the contact other than the data input and output contact is formed so as to avoid the disconnection detecting signal pattern(s) of the first disconnection detecting signal layer and/or the second disconnection detecting signal layer in which the shield pattern is formed. Therefore, in this embodiment, the cross talk is reduced by an operation of the shield pattern which is formed in the first disconnection detecting signal layer or the second disconnection detecting signal layer. In other words, according to the flexible cable in accordance with at least an embodiment of the present invention, both of prevention of illegal acquisition of data and reduction of the cross talk are attained.

In at least an embodiment of the present invention, it is preferable that the data signal layer is formed with a clock signal pattern transmitting a clock signal as the signal pattern, at least a part of the signal pattern other than the clock signal pattern is formed so as to be covered by the shield pattern, and at least a part of the clock signal pattern is formed so as to avoid the shield pattern. According to this structure, a rising speed and a falling speed of the clock signal can be increased and rounding of the clock signal waveform is restrained while reducing the cross talk.

In at least an embodiment of the present invention, it is preferable that the flexible cable is formed in a long and thin elongated shape in one direction, the disconnection detecting signal pattern(s) of the first disconnection detecting signal layer and/or the second disconnection detecting signal layer in which the shield pattern is formed is formed on one end side in a widthwise direction of the flexible cable, and the clock signal pattern is formed in an end part on the other side in the widthwise direction of the flexible cable. According to this structure, a distance between the data signal pattern, which is formed so as to be covered by the disconnection detecting signal pattern of the first disconnection detecting signal layer and the disconnection detecting signal pattern of the second disconnection detecting signal layer, and the clock signal pattern can be increased. Therefore, noise in the data signal caused by the clock signal is reduced.

In at least an embodiment of the present invention, it is preferable that the flexible cable is provided with a contact connection part which is connected with the data input and output contact and a plurality of the contacts, and an area of the contact connection part is larger than an area of arrangement region of the data input and output contact and a plurality of the contacts. According to this structure, the data input and output contact can be completely covered by the contact connection part. Therefore, attachment of a signal line for data illegal acquisition to the data input and output contact is prevented by the contact connection part.

In at least an embodiment of the present invention, it is preferable that the disconnection detecting signal pattern is formed over an entire region of one of the first disconnection detecting signal layer and the second disconnection detecting signal layer in the contact connection part. According to this structure, when the flexible cable is cut for trying to attach a signal line for data illegal acquisition to the data input and output contact, the disconnection detecting signal pattern is easily disconnected. Therefore, the criminal act by a criminal is easily detected.

In at least an embodiment of the present invention, it is preferable that the flexible cable is formed in a long and thin elongated shape in one direction, and the disconnection detecting signal pattern is formed so as to be turned around multiple times in a widthwise direction of the flexible cable. According to this structure, when the disconnection detecting signal layer is cut for trying to attach a signal line for data illegal acquisition to the data signal pattern, the disconnection detecting signal pattern is easily disconnected. Therefore, the criminal act by a criminal is easily detected.

In at least an embodiment of the present invention, it is preferable that the first disconnection detecting signal layer and the second disconnection detecting signal layer are formed with a short circuit detecting signal pattern transmitting a short circuit detecting signal for detecting a short circuit between the disconnection detecting signal pattern and the short circuit detecting signal pattern. According to this structure, in a case that a criminal performs a certain trick to the disconnection detecting signal pattern so as not to function the disconnection detecting signal, the criminal act is detected by the short circuit detecting function of the short circuit detecting signal pattern.

The flexible cable in accordance with at least an embodiment of the present invention may be used in a medium processing device which is provided with a data input and output contact and a plurality of contacts. According to the medium processing device, both of prevention of illegal acquisition of data from the flexible cable and reduction of the cross talk in the flexible cable are attained.

In at least an embodiment of the present invention, it is preferable that the flexible cable includes a contact connection part which is connected with the data input and output contact and a plurality of the contacts, and a terminal covering part which is formed so as to be connected with the contact connection part and is turned around so as to cover at least a connected portion of the data input and output contact with the contact connection part and is fixed to the contact connection part. According to this structure, attachment of a signal line for data illegal acquisition to the connected portion of the data input and output contact with the contact connection part is prevented by the terminal covering part.

In at least an embodiment of the present invention, it is preferable that the first disconnection detecting signal layer and/or the second disconnection detecting signal layer are(is) formed with a first disconnection detecting signal pattern, which is the disconnection detecting signal pattern on an input side for the disconnection detecting signal, and a second disconnection detecting signal pattern which is the disconnection detecting signal pattern on an output side for the disconnection detecting signal, the contact connection part and the terminal covering part are formed with a land for connecting the first disconnection detecting signal pattern with the second disconnection detecting signal pattern, the terminal covering part is fixed to the contact connection part by soldering the land of the terminal covering part to the land of the contact connection part, and the first disconnection detecting signal pattern and the second disconnection detecting signal pattern are connected with each other by soldering the land of the terminal covering part to the land of the contact connection part. According to this structure, the terminal covering part is hard to be torn off from the contact connection part. Therefore, attachment of a signal line for data illegal acquisition to the connected portion of the data input and output contact with the contact connection part is effectively prevented. Further, in this case, when the terminal covering part is torn off from the contact connection part, the land of the terminal covering part is separated from the land of the contact connection part. Therefore, when the terminal covering part is torn off from contact connection part, disconnection of the disconnection detecting signal pattern is detected. Accordingly, the criminal act by a criminal is detected at an early stage.

In at least an embodiment of the present invention, it is preferable that the medium processing device is provided with a connector with which the flexible cable is connected, and the disconnection detecting signal pattern serves as a function for detecting detachment of the flexible cable from the connector. According to this structure, when a criminal pulls out the flexible cable from the connector for attaching a signal line for data illegal acquisition to the data signal pattern, the criminal act is detected by the detachment detecting function of the disconnection detecting signal pattern. Therefore, the criminal act by a criminal is detected at an early stage.

As described above, according to the flexible cable in at least an embodiment of the present invention, both of prevention of illegal acquisition of data and reduction of the cross talk are attained. Further, according to the medium processing device in at least an embodiment of the present invention, both of prevention of illegal acquisition of data from the flexible cable and reduction of the cross talk in the flexible cable are attained.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which:

FIG. 1 is an explanatory side view showing a schematic structure of a medium processing device in accordance with an embodiment of the present invention.
FIG. 2 is a plan view showing a state that IC contacts are contacted with a card shown in FIG. 1.
FIG. 3 is a plan view showing a flexible cable in FIG. 1.
FIG. 4 is a plan view showing a connection part of IC contacts with a flexible cable shown in FIG. 1.
FIG. 5 is a cross-sectional view showing the "E-E" cross section in FIG. 4.
FIG. 6 is a cross-sectional view showing the "F-F" cross section in FIG. 4.
FIG. 7 is a cross-sectional view showing the "G-G" cross section in FIG. 3.
FIG. 8 is a block diagram showing a connecting relationship of signal patterns in the flexible cable shown in FIG. 1.
FIG. 9 is a cross-sectional view showing a connection part of an IC contact with a flexible cable in accordance with another embodiment of the present invention.

DESCRIPTION OF EMBODIMENTS

Figure 1:
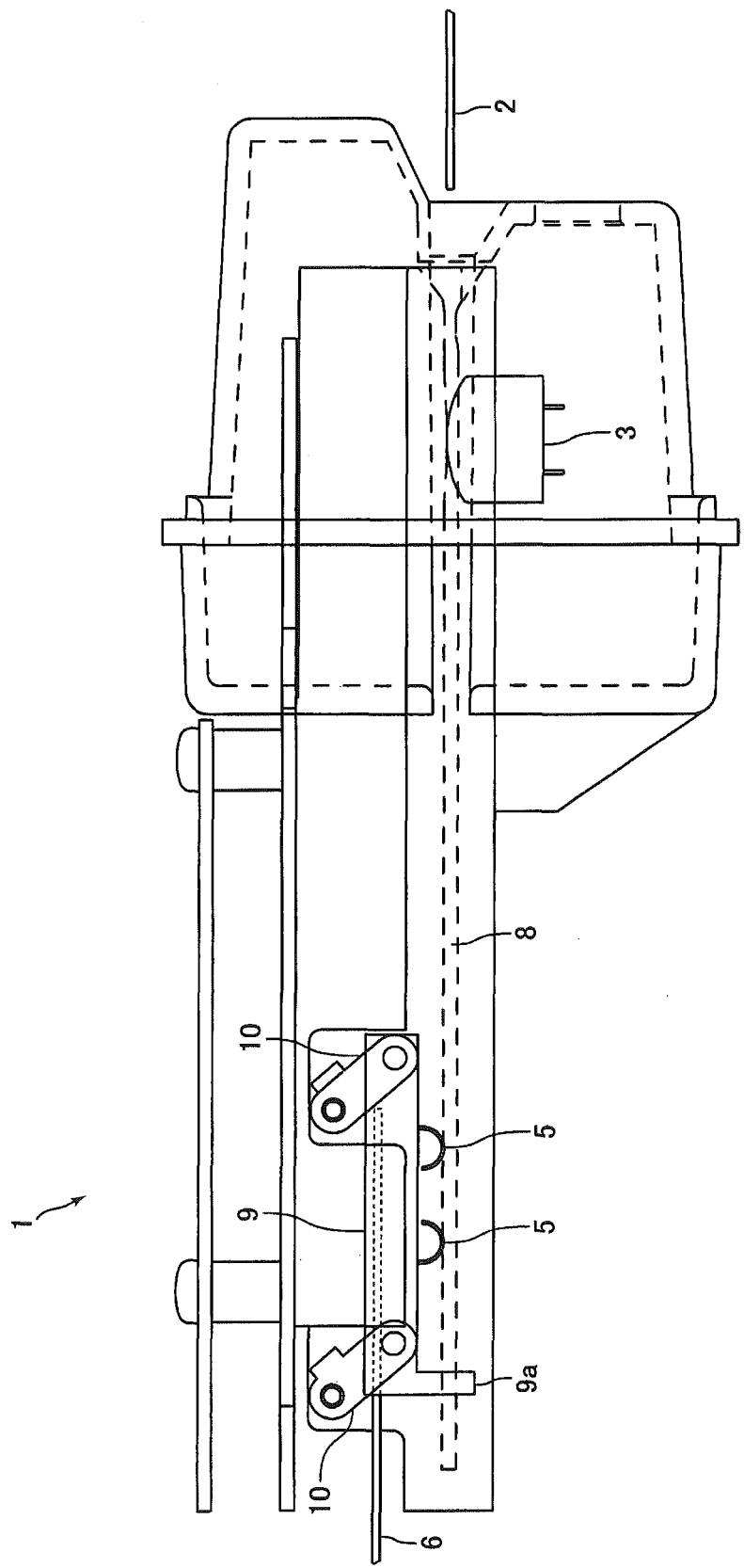
[FIG. 1]
Figure 2:
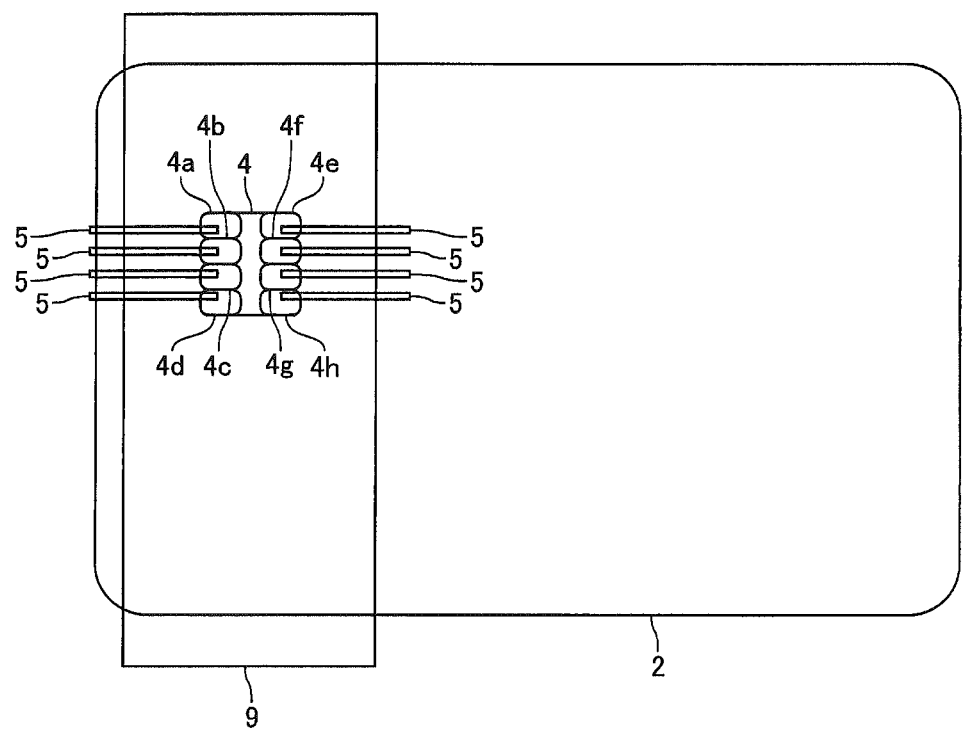
[FIG. 2]

An embodiment of the present invention will be described below with reference to the accompanying drawings.
(Schematic Structure of Medium Processing Device)
FIG. 1 is an explanatory side view showing a schematic structure of a medium processing device 1 in accordance with an embodiment of the present invention. FIG. 2 is a plan view showing a state that IC contacts 5 are contacted with a card 2 shown in FIG. 1.

The medium processing device 1 in this embodiment is a card reader which is structured to perform reading of data recorded in a card 2 that is a recording medium and writing of data to the card 2. Specifically, the medium processing device 1 is a so-called dip type card reader in which a user manually inserts a card 2 into an inside of the device and pulls out the card 2 from the inside of the device. The medium processing device 1 is mounted on and used in a predetermined host device.

The medium processing device 1 includes a magnetic head 3 structured to perform reading of magnetic data recorded in a card 2 and eight pieces of an IC contact 5 structured to be contacted with a terminal part 4 formed on the card 2. A flexible cable 6 is connected with a plurality of the IC contacts 5. Further, a card passage 8 where the card 2 is passed is formed in the inside of the medium processing device 1.

The card 2 is, for example, a rectangular card made of vinyl chloride whose thickness is about 0.7-0.8 mm. A magnetic stripe in which magnetic data are recorded is formed on one face of the card 2. Further, the terminal part 4 is formed on the other face of the card 2. In other words, the card 2 in this embodiment is a contact type IC card with a magnetic stripe. In accordance with an embodiment of the present invention, an antenna for communication may be incorporated into the card 2. Further, the card 2 may be a PET (polyethylene terephthalate) card whose thickness is about 0.18-0.36 mm or may be a paper card having a predetermined thickness.

The terminal part 4 is, as shown in FIG. 2, provided with eight connecting terminals 4a through 4h. The connecting terminal 4a is a terminal for a power supply, the connecting terminal 4b is a terminal for a reset signal, the connecting terminal 4c is a terminal for a clock signal, the connecting terminal 4e is a terminal for grounding (ground), the connecting terminal 4f is a terminal for a program power supply, and the connecting terminal 4g is a data input and output terminal for inputting and outputting data. Further, the connecting terminals 4d and 4h are a spare terminal.

The magnetic head 3 is disposed so that its magnetic gap is exposed in the card passage 8. In this embodiment, when a user inserts a card 2 into the inside of the device or, when the user pulls out the card 2 having been inserted into the inside of the device, magnetic data of the card 2 are read by the magnetic head 3.

The IC contacts 5 are disposed on a rear end side of the medium processing device 1 and are fixed in a positioned state to an IC contact block 9. Lever members 10 and a tension coil spring (not shown) urging the IC contact block 9 toward an insertion side for a card 2 are, for example, attached to the IC contact block 9. In this embodiment, when a card 2 is abutted with a card abutting part 9a which is formed at a rear end of the IC contact block 9, the lever members 10 are turned and the IC contact block 9 is moved so that the eight IC contacts 5 are respectively contacted with the connecting terminals 4a through 4h. When the IC contacts 5 are contacted with the terminal part 4, data are capable of being exchanged between the medium processing device 1 and the card 2. Further, the card 2 is pulled out in this state, the IC contact block 9 is moved by an urging force of the tension coil spring and the IC contacts 5 are retreated from the card passage 8. In this embodiment, the IC contact 5 contacted with the connecting terminal 4g is a data input and output contact for inputting and outputting data and other IC contacts 5 are contacts other than the data input and output contact.

Figure 3:
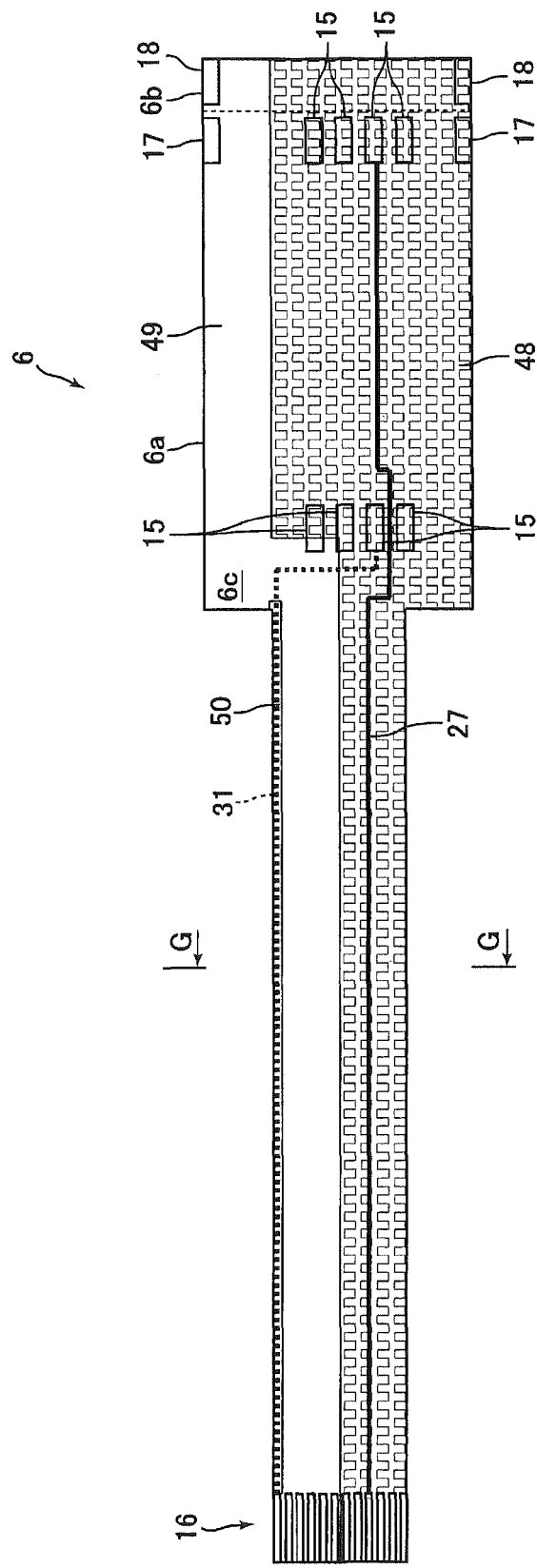
[FIG. 3]
Figure 4:
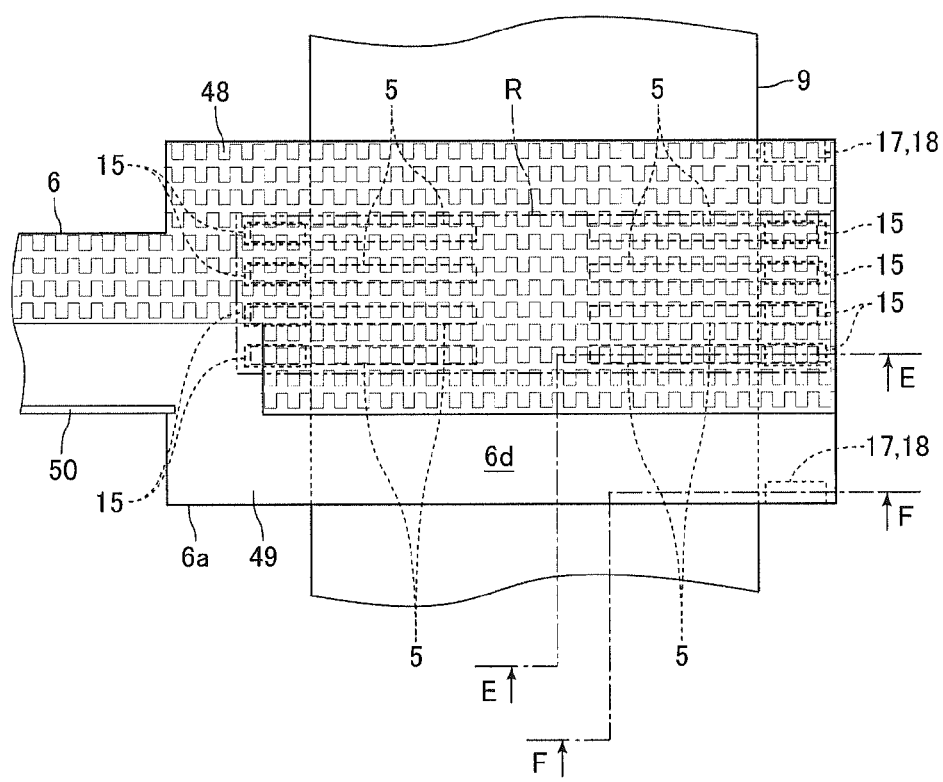
[FIG. 4]
Figure 5:
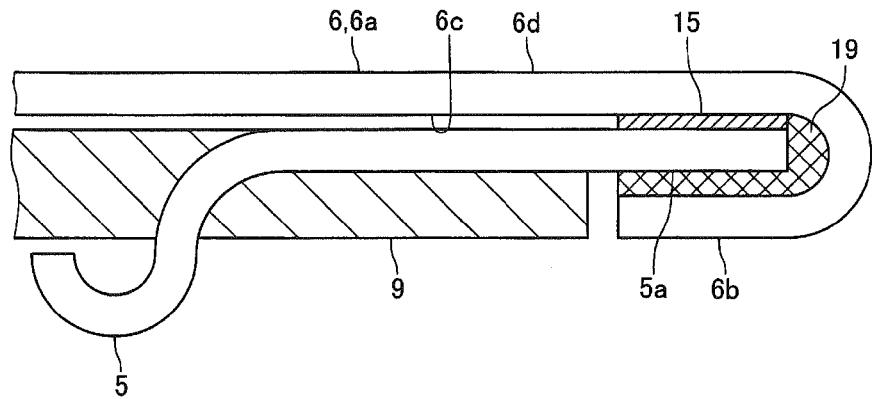
[FIG. 5]
Figure 6:
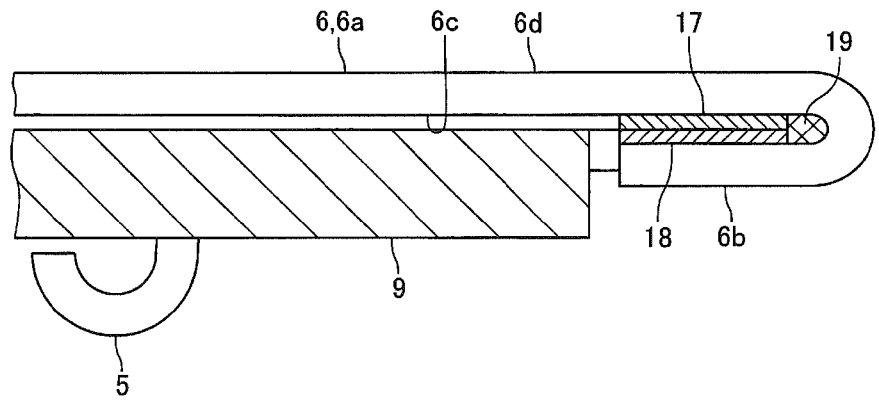
[FIG. 6]
Figure 7:
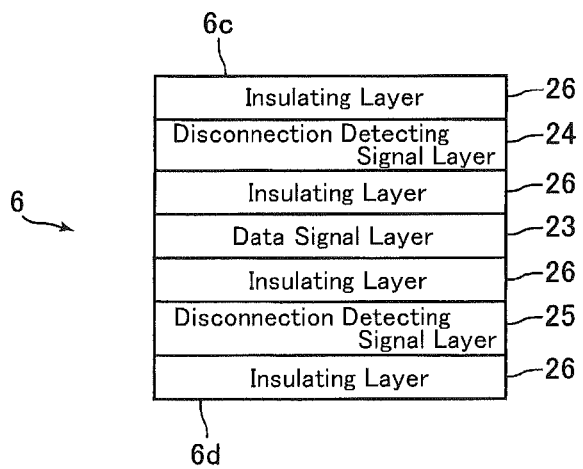
[FIG. 7]
Figure 8:
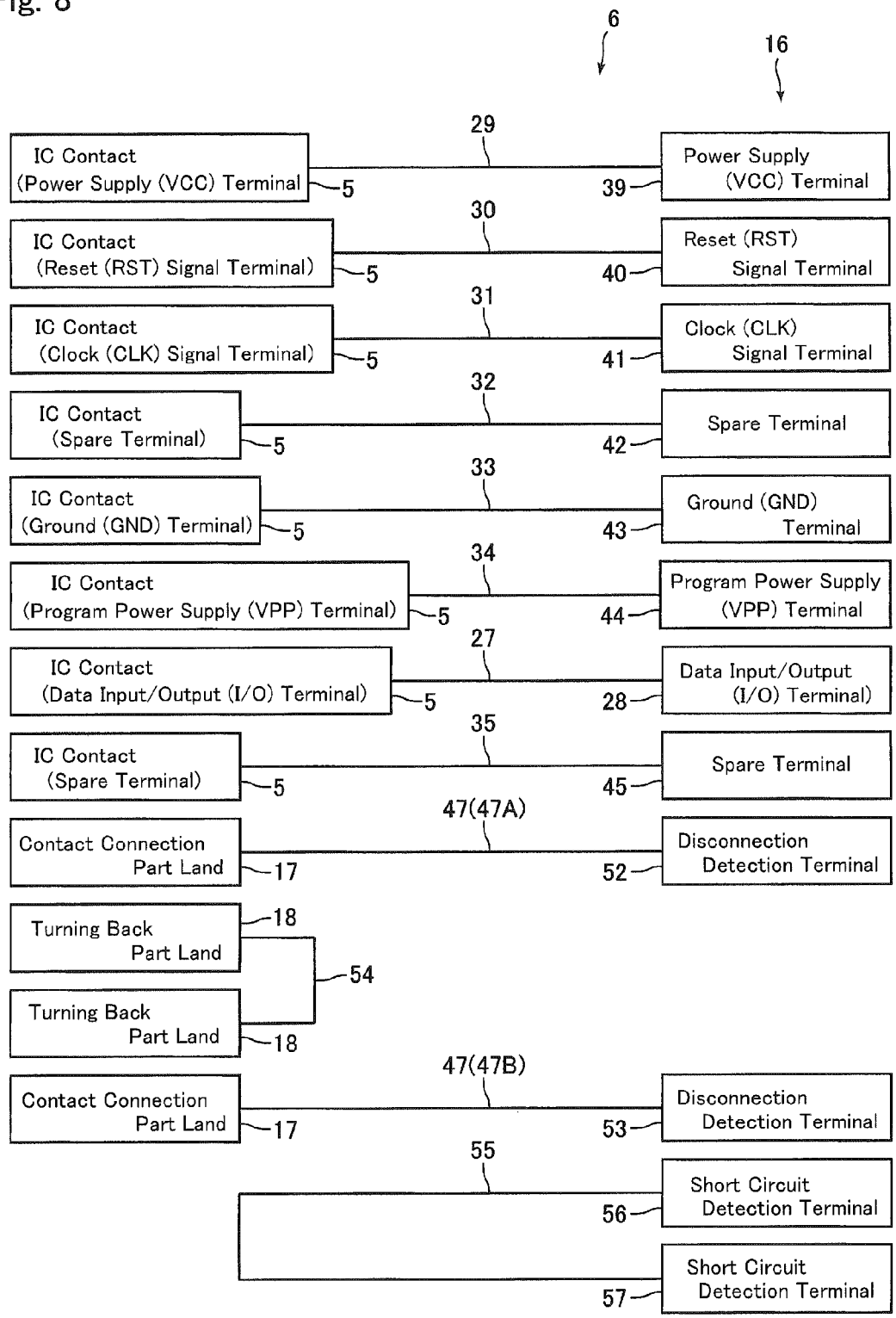
[FIG. 8]

One end of the flexible cable 6 is connected with the eight IC contacts 5 and the other end of the flexible cable 6 is connected with a connector (not shown) provided in a host device on which the medium processing device 1 is mounted. The connector is mounted in a region of the host device where security is assured. Next, the structure of the flexible cable 6 and a connection part of the IC contacts 5 with the flexible cable 6 will be described below.
(Structure of Flexible Cable and Structure of Connection Part of IC Contacts with Flexible Cable)
FIG. 3 is a plan view showing the flexible cable 6 in FIG. 1. FIG. 4 is a plan view showing a connection part of the IC contacts 5 with the flexible cable 6 shown in FIG. 1. FIG. 5 is a cross-sectional view showing the "E-E" cross section in FIG. 4. FIG. 6 is a cross-sectional view showing the "F-F" cross section in FIG. 4. FIG. 7 is a cross-sectional view showing the "G-G" cross section in FIG. 3. FIG. 8 is a block diagram showing a connecting relationship of signal patterns in the flexible cable 6 shown in FIG. 1.

The flexible cable 6 is formed in an elongated shape which is long and thin in one direction. The flexible cable 6 is, as shown in FIG. 3, provided with a contact connection part 6a where eight contact lands 15 which are connected with the IC contacts 5 are formed, and a turning back part 6b as a terminal covering part which is turned around so as to cover a connected portion of the IC contacts 5, which are to be contacted with the connecting terminals 4e through 4h, with the contact lands 15 and is fixed to the contact connection part 6a. Further, one end side in a longitudinal direction of the flexible cable 6 is formed with a connecting terminal part 16 which is connected with the connector of the host device.

The contact connection part 6a is formed on the other end side in the longitudinal direction of the flexible cable 6. Further, the contact connection part 6a is formed in a rectangular shape. The contact connection part 6a is, as described above, formed with eight pieces of the contact land 15. The eight contact lands 15 are formed on a front face 6c of the flexible cable 6. The contact land 15 is soldered with an IC contact terminal 5a of the IC contact 5 (see FIG. 5) which is protruded from the IC contact block 9 in the longitudinal direction of the flexible cable 6. The flexible cable 6 is fixed to a plurality of the IC contacts 5 by soldering the contact lands 15 to the IC contact terminals 5a.

The turning back part 6b is formed so as to be connected with the contact connection part 6a in the longitudinal direction of the flexible cable 6. A land 17 is formed on a portion of the contact connection part 6a in the vicinity of the boundary between the contact connection part 6a and the turning back part 6b, and a land 18 is formed on a portion of the turning back part 6b in the vicinity of the boundary between the contact connection part 6a and the turning back part 6b. Specifically, the land 17 is formed on both end sides of the contact connection part 6a in a widthwise direction perpendicular to the longitudinal direction of the flexible cable 6, and the land 18 is formed on both end sides of the turning back part 6b in the widthwise direction of the flexible cable 6.

The turning back part 6b is, as shown in FIG. 5, turned around so as to cover connected portions of the IC contact terminals 5a of the IC contacts 5, which are to be contacted with the connecting terminals 4e through 4h, and the contact lands 15 from a side of the IC contact terminals 5a (in other words, from a lower side in FIG. 5) and is fixed to the contact connection part 6a. When the turning back part 6b is turned around, the land 17 and the land 18 are overlapped with each other as shown in FIG. 6. In this embodiment, the land 17 and the land 18 are soldered each other and the turning back part 6b is fixed to the contact connection part 6a. Further, an adhesive 19 is applied between the contact connection part 6a and the turning back part 6b and the turning back part 6b is further fixed to the contact connection part 6a by the adhesive 19.

A width of the contact connection part 6a and a width of the turning back part 6b are equal to each other in the widthwise direction of the flexible cable 6. Further, the widths of the contact connection part 6a and the turning back part 6b are wider than a width of the other portion of the flexible cable 6 in the widthwise direction of the flexible cable 6. As shown in FIG. 4, the width of the contact connection part 6a is wider than a width of an arrangement region "R" of the eight IC contacts 5 in the widthwise direction of the flexible cable 6.

Further, the width of the contact connection part 6a is wider than a width of the arrangement region "R" of the IC contacts 5 in the longitudinal direction of the flexible cable 6. In other words, an area of the contact connection part 6a is larger than an area of the arrangement region "R" of the IC contacts 5. Further, the contact connection part 6a completely covers the entire arrangement region "R" of the IC contacts 5.

The flexible cable 6 is, as shown in FIG. 7, formed in a multilayer structure which is provided with a data signal layer 23, disconnection detecting signal layers 24 and 25, and insulating layers 26. In the flexible cable 6, an insulating layer 26, a disconnection detecting signal layer 24, an insulating layer 26, a data signal layer 23, an insulating layer 26, a disconnection detecting signal layer 25 and an insulating layer 26 are laminated from a front face 6c to a rear face 6d of the flexible cable 6 in this order. In other words, the front face of the data signal layer 23 is covered by the disconnection detecting signal layer 24 through the insulating layer 26 and the rear face of the data signal layer 23 is covered by the disconnection detecting signal layer 25 through the insulating layer 26. The disconnection detecting signal layer 24 in this embodiment is a first disconnection detecting signal layer and the disconnection detecting signal layer 25 is a second disconnection detecting signal layer.

The data signal layer 23 is formed with a data signal pattern 27 (see FIG. 8) which transmits a data signal from the IC contact 5 contacted with the connecting terminal 4g to the host device on which the medium processing device 1 is mounted. One end of the data signal pattern 27 is connected with the IC contact 5 which is to be contacted with the connecting terminal 4g through the contact land 15 and the other end of the data signal pattern 27 is connected with a data input and output terminal 28 which is formed in the connecting terminal part 16. The flexible cable 6 in this embodiment is formed with no through hole with which the data signal pattern 27 is connected.

Further, the data signal layer 23 is formed with seven signal patterns other than the data signal pattern 27. In other words, the data signal layer 23 is formed with a power supply pattern 29 (see FIG. 8) whose one end is connected with the IC contact 5, which is to be contacted with the connecting terminal 4a through the contact land 15, a reset signal pattern 30 (see FIG. 8) whose one end is connected with the IC contact 5, which is to be contacted with the connecting terminal 4b through the contact land 15, a clock signal pattern 31 (see FIG. 8) whose one end is connected with the IC contact 5, which is to be contacted with the connecting terminal 4c through the contact land 15, a spare pattern 32 (see FIG. 8) whose one end is connected with the IC contact 5, which is to be contacted with the connecting terminal 4d through the contact land 15, a ground pattern 33 (see FIG. 8) whose one end is connected with the IC contact 5, which is to be contacted with the connecting terminal 4e through the contact land 15, a program power supply pattern 34 (see FIG. 8) whose one end is connected with the IC contact 5, which is to be contacted with the connecting terminal 4f through the contact land 15, and a spare pattern 35 (see FIG. 8) whose one end is connected with the IC contact 5, which is to be contacted with the connecting terminal 4f through the contact land 15.

The other end of the power supply pattern 29 is connected with a power supply terminal 39 formed in the connecting terminal part 16, the other end of the reset signal pattern 30 is connected with a reset signal terminal 40 formed in the connecting terminal part 16, the other end of the clock signal pattern 31 is connected with a clock signal terminal 41 formed in the connecting terminal part 16, and the other end of the spare pattern 32 is connected with a spare terminal 42 formed in the connecting terminal part 16. Further, the other end of the ground pattern 33 is connected with a ground terminal 43 formed in the connecting terminal part 16, the other end of the program power supply pattern 34 is connected with a program power supply terminal 44 formed in the connecting terminal part 16, and the other end of the spare pattern 35 is connected with a spare terminal 45 formed in the connecting terminal part 16.

The disconnection detecting signal layers 24 and 25 are formed with a disconnection detecting signal pattern 47 (see FIG. 8). In order to prevent attachment of a signal line for skimming to the data signal pattern 27, the disconnection detecting signal pattern 47 transmits a disconnection detecting signal for detecting the disconnection of the disconnection detecting signal pattern 47 itself. The disconnection detecting signal pattern 47 is formed so as to be turned around a plurality of times in the widthwise direction of the flexible cable 6 and is formed in a substantially net shape as a whole. The disconnection detecting signal pattern 47 is formed over the entire region of the disconnection detecting signal layer 24.

On the other hand, the disconnection detecting signal pattern 47 is formed in a part of the disconnection detecting signal layer 25 and a shield pattern is formed at a position avoiding the disconnection detecting signal pattern 47. In other words, the disconnection detecting signal layer 25 is, as shown in FIG. 3, formed with a disconnection detection region 48 where the disconnection detecting signal pattern 47 is formed and a shield region 49 where the shield pattern is formed. Further, a non-shielding region 50 where a shield pattern is not formed is formed in a part of the shield region 49.

The disconnection detection region 48 is formed on one end side in the widthwise direction of the flexible cable 6 and the shield region 49 is formed on the other end side in the widthwise direction of the flexible cable 6. The disconnection detection region 48 and the shield region 49 are formed so that an area of the disconnection detection region 48 is larger than an area of the shield region 49 in the contact connection part 6a and the turning back part 6b. In other words, in the contact connection part 6a and the turning back part 6b, the width of the disconnection detection region 48 in the widthwise direction of the flexible cable 6 is wider than the width of the shield region 49 except a part of the contact connection part 6a.

Further, in the portion other than the contact connection part 6a and the turning back part 6b of the flexible cable 6, the disconnection detection region 48 and the shield region 49 are formed so that an area of the disconnection detection region 48 and an area of the shield region 49 are substantially equal to each other. In other words, in the portion other than the contact connection part 6a and the turning back part 6b of the flexible cable 6, a width of the disconnection detection region 48 and a width of the shield region 49 in the widthwise direction of the flexible cable 6 are equal to each other.

The disconnection detection region 48 is formed, when viewed in a thickness direction of the flexible cable 6, so as to overlap with the entire regions of all of the seven contact lands 15 except the contact land 15 connected with the IC contact 5 which is to be contacted with the connecting terminal 4d, and overlap with a part of the contact land 15 connected with the IC contact 5 which is to be contacted with the connecting terminal 4d. Further, on one end side of the contact connection part 6a in the longitudinal direction of the flexible cable 6 which is an opposite side to the side where the turning back part 6b is formed, the shield region 49 is formed so as to be widened to one end side in the widthwise direction of the flexible cable 6 and, when viewed in the thickness direction of the flexible cable 6, the shield region 49 is formed in a substantially "L"-shape. On one end side of the contact connection part 6a, a width of the disconnection detection region 48 and a width of the shield region 49 are equal to each other in the widthwise direction of the flexible cable 6.

The non-shielding region 50 is formed on the other end part in the widthwise direction of the flexible cable 6. Further, the non-shielding region 50 is formed from a boundary part between the contact connection part 6a and a portion other than the contact connection part 6a and the turning back part 6b to one end of the flexible cable 6 in the longitudinal direction of the flexible cable 6 where the connecting terminal part 16 is formed. A width of the non-shielding region 50 in the widthwise direction of the flexible cable 6 is set to be a width so as to be capable of covering one signal pattern.

The data signal pattern 27 is, as shown in FIG. 3, routed in an inside of the disconnection detection region 48 when viewed in the thickness direction of the flexible cable 6. In other words, the data signal pattern 27 is formed so as to be covered by the disconnection detecting signal pattern 47 in the disconnection detecting signal layer 24 and the disconnection detecting signal pattern 47 in the disconnection detecting signal layer 25.

On the other hand, seven signal patterns 29 through 35 other than the data signal pattern 27 are, when viewed in the thickness direction of the flexible cable 6, routed on an outer side of the disconnection detection region 48 except one end sides of the signal patterns 29 through 35 which are connected with the contact lands 15. In other words, the signal patterns 29 through 35 are formed so as to avoid the disconnection detecting signal pattern 47 of the disconnection detecting signal layer 25.

Specifically, the power supply pattern 29, the reset signal pattern 30, the spare pattern 32, the ground pattern 33, the program power supply pattern 34 and the spare pattern 35 are formed so that their rear faces are covered by the shield region 49 (in other words, covered by the shield pattern) except their one end sides connected with the contact lands 15. Further, the clock signal pattern 31 for transmitting a clock signal is formed so that a part of its rear face is covered by the shield region 49 of the contact connection part 6a except one end side connected with the contact land 15 and most portion of its rear face is covered by the non-shielding region 50. In other words, most portion of the clock signal pattern 31 is formed so as to avoid the shield pattern and is formed on the other end part in the widthwise direction of the flexible cable 6 in the portion other than the contact connection part 6a and the turning back part 6b of the flexible cable 6.

As described above, the disconnection detecting signal layers 24 and 25 are formed with the disconnection detecting signal pattern 47. In this embodiment, a disconnection detecting signal pattern 47A on an input side for a disconnection detecting signal and a disconnection detecting signal pattern 47B on an output side for a disconnection detecting signal are formed as the disconnection detecting signal pattern 47 in the disconnection detecting signal layers 24 and 25. The disconnection detecting signal pattern 47A in this embodiment is a first disconnection detecting signal pattern and the disconnection detecting signal pattern 47B is a second disconnection detecting signal pattern.

As shown in FIG. 8, one end of the disconnection detecting signal pattern 47A is connected with one of the lands 17 of the contact connection part 6a, and the other end of the disconnection detecting signal pattern 47A is connected with the disconnection detection terminal 52 formed in the connecting terminal part 16. One end of the disconnection detecting signal pattern 47B is connected with the other of the lands 17 of the contact connection part 6a, and the other end of the disconnection detecting signal pattern 47B is connected with the disconnection detection terminal 53 formed in the connecting terminal part 16. One of the lands 18 and the other of the lands 18 formed in the turning back part 6b are connected with each other through a land-to-land signal pattern 54. In accordance with an embodiment of the present invention, it may be structured that one end of the disconnection detecting signal pattern 47A is connected with one of the lands 18 in the turning back part 6b and one end of the disconnection detecting signal pattern 47B is connected with the other of the lands 18 in the turning back part 6b. In this case, one of the lands 17 and the other of the lands 17 in the contact connection part 6a are connected with each other through a land-to-land signal pattern.

As described above, the land 17 and the land 18 are soldered each other and the two lands 18 are connected with each other through the land-to-land signal pattern 54. Therefore, the disconnection detection terminal 52 and the disconnection detection terminal 53 are electrically connected with each other through the disconnection detecting signal patterns 47A and 47B, the lands 17 and 18, and the land-to-land signal pattern 54. In this embodiment, when a disconnection detecting signal which is inputted from the host device through the disconnection detection terminal 52 is not returned to the host device through the disconnection detection terminal 53, disconnection of the disconnection detecting signal patterns 47A and 47B is detected. As described above, in this embodiment, the lands 17 and 18 and the land-to-land signal pattern 54 connect the disconnection detecting signal pattern 47A with the disconnection detecting signal pattern 47B so that the disconnection detecting signal patterns 47A and 47B are functioned.

Further, when the flexible cable 6 is detached from the connector provided in the host device, a disconnection detecting signal is not inputted from the host device to the flexible cable 6 and, as a result, the disconnection detecting signal is not returned to the host device. Therefore, in this embodiment, detachment of the flexible cable 6 from the connector is also detected by utilizing the disconnection detecting signal patterns 47A and 47B. In other words, the disconnection detecting signal patterns 47A and 47B also function to detect detachment of the flexible cable 6 from the connector.

Further, the disconnection detection region 48 of the disconnection detection layer 25 and the disconnection detecting signal layer 24 are formed with a short circuit detecting signal pattern 55 (see FIG. 8). The short circuit detecting signal pattern 55 transmits a short circuit detecting signal for detecting a short circuit between the disconnection detecting signal pattern 47 and the short circuit detecting signal pattern 55. As shown in FIG. 8, one end of the short circuit detecting signal pattern 55 is connected with the short circuit detection terminal 56 formed in the connecting terminal part 16, and the other end of the short circuit detecting signal pattern 55 is connected with the short circuit detection terminal 57 formed in the connecting terminal part 16.

(Principal Effects in this Embodiment)

As described above, in the flexible cable 6 in this embodiment, the data signal pattern 27 is formed so as to be covered by the disconnection detecting signal pattern 47 of the disconnection detecting signal layer 24 and the disconnection detecting signal pattern 47 of the disconnection detecting signal layer 25. Therefore, when a criminal is trying to attach a signal line for data illegal acquisition to the data signal pattern 27, the criminal act is detected by utilizing the disconnection detecting signal pattern 47. Further, the flexible cable 6 in this embodiment is not formed with a through hole with which the data signal pattern 27 is connected. Therefore, in this embodiment, attachment of a signal line for data illegal acquisition to the data signal pattern 27 is prevented and, as a result, illegal acquisition of data from the flexible cable 6 is prevented.

Further, in this embodiment, the power supply pattern 29, the reset signal pattern 30, the spare pattern 32, the ground pattern 33, the program power supply pattern 34 and the spare pattern 35 are formed so that their rear faces are formed so as to be covered by the shield region 49 except their one end sides connected with the contact lands 15. Therefore, a cross talk is reduced by operation of the shield pattern formed in the shield region 49. In other words, in this embodiment, both of prevention of illegal acquisition of data and reduction of the cross talk are attained.

In this embodiment, most portion of the clock signal pattern 31 is formed so as to be covered by the non-shielding region 50. Therefore, in this embodiment, a rising speed and a falling speed of the clock signal transmitted through the clock signal pattern 31 can be increased to restrain rounding of the clock signal waveform.

In this embodiment, the disconnection detecting signal pattern 47 of the disconnection detecting signal layer 25 is formed on one end side in the widthwise direction of the flexible cable 6, and the clock signal pattern 31 is formed in the other end part in the widthwise direction of the flexible cable 6. In other words, in this embodiment, the data signal pattern 27 which is formed so as to be covered by the disconnection detecting signal pattern 47 in the disconnection detecting signal layer 25 is formed on one end side in the widthwise direction of the flexible cable 6, and the clock signal pattern 31 is formed in the other end part in the widthwise direction of the flexible cable 6. Therefore, a distance between the data signal pattern 27 and the clock signal pattern 31 can be increased. Accordingly, in this embodiment, noise in the data signal caused by the clock signal is reduced.

In this embodiment, an area of the contact connection part 6a is larger than an area of the arrangement region "R" of the IC contacts 5 and the contact connection part 6a completely covers the entire region of the arrangement region "R" of the IC contacts 5. Further, in this embodiment, the turning back part 6b is turned around so as to cover the connected portion of the IC contact terminals 5a of the IC contacts 5, which are to be contacted with the connecting terminals 4e through 4h, with the contact lands 15 and is fixed to the contact connection part 6a. Therefore, in this embodiment, the IC contact 5 to be contacted with the connecting terminal 4g and the connected portion of the IC contact terminal 5a of the IC contact 5 to be contacted with the connecting terminal 4g with the contact land 15 are completely covered by the contact connection part 6a and the turning back part 6b. Accordingly, in this embodiment, attachment of a signal line for data illegal acquisition to the IC contact 5 to be contacted with the connecting terminal 4g and attachment of a signal line for data illegal acquisition to the connected portion of the IC contact terminal 5a of the IC contact 5 to be contacted with the connecting terminal 4g with the contact connection part 6a are prevented by the contact connection part 6a and the turning back part 6b.

Especially, in this embodiment, the land 17 of the contact connection part 6a and the land 18 of the turning back part 6b are soldered each other and thus the turning back part 6b is not easily torn off from the contact connection part 6a. Therefore, in this embodiment, attachment of a signal line for data illegal acquisition to the connected portion of the IC contact 5 to be contacted with the connecting terminal 4g with the contact connection part 6a is effectively prevented.

In this embodiment, the disconnection detecting signal pattern 47 is formed over the entire region of the disconnection detecting signal layer 24. Therefore, when the flexible cable 6 is cut for attaching a signal line for data illegal acquisition to the IC contact 5 to be contacted with the connecting terminal 4g, the disconnection detecting signal pattern 47 is easily disconnected. Further, in this embodiment, the disconnection detecting signal pattern 47 is formed so as to be turned around multiple times in the widthwise direction of the flexible cable 6 and is formed in a substantially net shape as a whole. Therefore, when the disconnection detecting signal layers 24 and 25 are cut for trying to attach a signal line for data illegal acquisition to the IC contact 5 to be contacted with the connecting terminal 4g or to the data signal pattern 27, the disconnection detecting signal pattern 47 is easily disconnected. Accordingly, in this embodiment, the criminal act by a criminal is easily detected.

In this embodiment, the disconnection detecting signal pattern 47A and the disconnection detecting signal pattern 47B are connected with each other through the land 17 of the contact connection part 6a and the land 18 of the turning back part 6b, which are soldered and fixed to each other, and the land-to-land signal pattern 54. Therefore, when the turning back part 6b is torn off from the contact connection part 6a, the disconnection of the disconnection detecting signal pattern 47 is detected. Accordingly, in this embodiment, the criminal act by a criminal is detected at an early stage.

In this embodiment, the short circuit detecting signal pattern 55 which transmits a short circuit detecting signal for detecting a short circuit between the disconnection detecting signal pattern 47 and the short circuit detecting signal pattern 55 is formed in the disconnection detection region 48 of the disconnection detection layer 25 and the disconnection detecting signal layer 24. Therefore, in a case that a criminal sets a certain trick to the disconnection detecting signal pattern 47 so as not to function the disconnection detecting signal, the criminal act is detected by the short circuit detecting function of the short circuit detecting signal pattern 55. In other words, in this embodiment, the criminal act by a criminal is easily detected.

In this embodiment, detachment of the flexible cable 6 from the connector is detected by utilizing the disconnection detecting signal pattern 47. Therefore, when a criminal pulls out the flexible cable 6 from the connector for attaching a signal line for skimming to the data signal pattern 27, the criminal act is detected by the detachment detecting function of the disconnection detecting signal pattern 47. Accordingly, in this embodiment, the criminal act by a criminal is detected at an early stage.

(Other Embodiments)

Although the present invention has been shown and described with reference to a specific embodiment, various changes and modifications will be apparent to those skilled in the art from the teachings herein.

Figure 9:
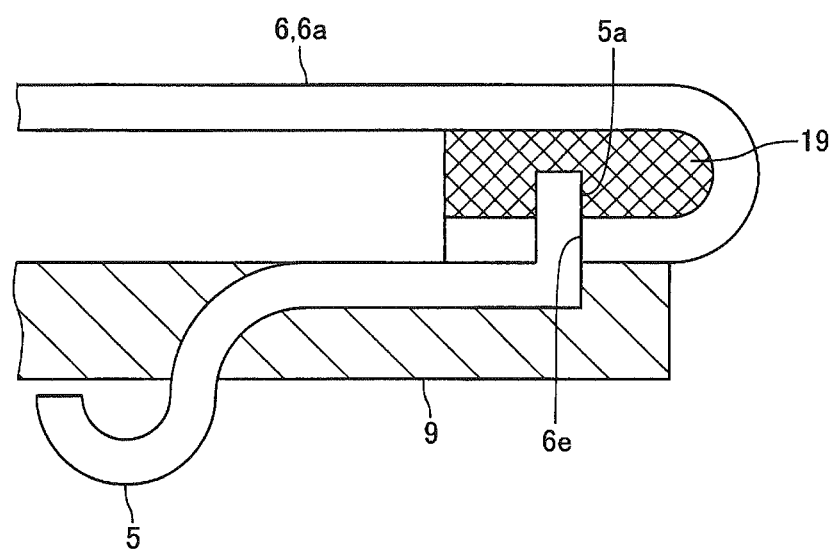
[FIG. 9]

In the embodiment described above, the contact lands 15 are formed in the contact connection part 6a and the contact lands 15 are soldered to the IC contact terminals 5a of the IC contacts 5 which are protruded from the IC contact block 9 in the longitudinal direction of the flexible cable 6. However, the present invention is not limited to this embodiment. For example, as shown in FIG. 9, it may be structured that through holes 6e are formed in the contact connection part 6a and the IC contact terminals 5a of the IC contacts 5 which are protruded from the IC contact block 9 in a thickness direction of the flexible cable 6 are inserted through the through holes 6e and soldered. In this case, the contact connection part 6a is turned around so as to cover the IC contact terminals 5a of the IC contacts 5 which are inserted through the through holes 6e. Further, a folded-back portion of the contact connection part 6a is fixed by an adhesive 19. In this case, the turning back part 6b is not formed in the flexible cable 6.

In the embodiment described above, a shield pattern is formed in the disconnection detecting signal layer 25. However, the present invention is not limited to this embodiment. For example, a shield pattern may be formed in the disconnection detecting signal layer 24. Further, a shield pattern may be formed in both of the disconnection detecting signal layer 24 and the disconnection detecting signal layer 25. Even when a shield pattern is formed in both of the disconnection detecting signal layer 24 and the disconnection detecting signal layer 25, the data signal pattern 27 is formed so as to be covered by the disconnection detecting signal pattern 47 of the disconnection detecting signal layer 24 and the disconnection detecting signal pattern 47 of the disconnection detecting signal layer 25.

In the embodiment described above, the medium processing device 1 is a dip type card reader in which a card 2 is manually inserted into an inside of the device and pulled out from the inside of the device by a user. However, the present invention is not limited to this embodiment. For example, the medium processing device to which the structure of at least an embodiment of the present invention is applied may be a card feeding type card reader which is provided with a card feeding mechanism. Further, the medium processing device to which the structure of at least an embodiment of the present invention is applied may be a device other than a card reader.

In the embodiment described above, the flexible cable 6 is connected with a plurality of IC contacts 5 but the flexible cable 6 may be connected with a data input and output contact and contacts other than the IC contacts 5. For example, the flexible cable 6 may be connected with a data input and output contact and contacts of a SAM socket which is connected with a SAM (Secure Application Module) for performing authentication of a non-contact type IC card.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

The invention claimed is:

1. A flexible cable structured to be connected with a data input and output contact for performing data input and/or data output and a plurality of contacts other than the data input and output contact, the flexible cable comprising:
   a data signal layer which is formed with a data signal pattern structured to be connected with the data input and output contact and a plurality of signal patterns connected with a plurality of the contacts;
   a first disconnection detecting signal layer which covers a front face of the data signal layer and is formed with a disconnection detecting signal pattern structured to transmit a disconnection detecting signal for detecting its own disconnection;
   a second disconnection detecting signal layer which covers a rear face of the data signal layer and is formed with a disconnection detecting signal pattern structured to transmit a disconnection detecting signal for detecting its own disconnection;

wherein the flexible cable is formed in a multilayer structure comprising the data signal layer, the first disconnection detecting signal layer and the second disconnection detecting signal layer;

wherein a shield pattern is formed in the first disconnection detecting signal layer and/or the second disconnection detecting signal layer at a position avoiding the disconnection detecting signal pattern;

wherein the data signal pattern is formed so as to be covered by the disconnection detecting signal pattern of the first disconnection detecting signal layer and the disconnection detecting signal pattern of the second disconnection detecting signal layer; and wherein at least a part of the signal pattern is formed so as to be covered by the shield pattern.

2. The flexible cable according to claim 1, wherein the data signal layer is formed with a clock signal pattern structured to transmit a clock signal as the signal pattern, at least a part of the signal pattern except the clock signal pattern is formed so as to be covered by the shield pattern, and at least a part of the clock signal pattern is formed at a position avoiding the shield pattern.

3. The flexible cable according to claim 2, wherein the flexible cable is formed in a long and thin elongated shape in one direction, the disconnection detecting signal pattern(s) of the first disconnection detecting signal layer and/or the second disconnection detecting signal layer in which the shield pattern is formed on one end side in a widthwise direction of the flexible cable, and the clock signal pattern is formed in an end part on the other side in the widthwise direction of the flexible cable.

4. The flexible cable according to claim 1, further comprising a contact connection part which is connected with the data input and output contact and a plurality of the contacts, wherein an area of the contact connection part is larger than an area of arrangement region of the data input and output contact and a plurality of the contacts.

5. The flexible cable according to claim 4, wherein the disconnection detecting signal pattern is formed over an entire region of one of the first disconnection detecting signal layer and the second disconnection detecting signal layer in the contact connection part.

6. The flexible cable according to claim 1, wherein the flexible cable is formed in a long and thin elongated shape in one direction, and the disconnection detecting signal pattern is formed so as to be folded multiple times in a widthwise direction of the flexible cable.

7. The flexible cable according to claim 1, wherein the first disconnection detecting signal layer and the second disconnection detecting signal layer are formed with a short circuit detecting signal pattern structured to transmit a short circuit detecting signal for detecting a short circuit between the disconnection detecting signal pattern and the short circuit detecting signal pattern.

8. A medium processing device comprising:

a flexible cable structured to be connected with a data input and output contact for performing data input and/or data output and a plurality of contacts other than the data input and output contact, the flexible cable comprising:

a data signal layer which is formed with a data signal pattern structured to be connected with the data input and output contact and a plurality of signal patterns structured to be connected with a plurality of the contacts;

a first disconnection detecting signal layer which covers a front face of the data signal layer and is formed with a disconnection detecting signal pattern structured to transmit a disconnection detecting signal for detecting its own disconnection;

a second disconnection detecting signal layer which covers a rear face of the data signal layer and is formed with a disconnection detecting signal pattern structured to transmit a disconnection detecting signal for detecting its own disconnection;

wherein the flexible cable is formed in a multilayer structure comprising the data signal layer, the first disconnection detecting signal layer and the second disconnection detecting signal layer;

wherein a shield pattern is formed in the first disconnection detecting signal layer and/or the second disconnection detecting signal layer at a position avoiding the disconnection detecting signal pattern;

wherein the data signal pattern is formed so as to be covered by the disconnection detecting signal pattern of the first disconnection detecting signal layer and the disconnection detecting signal pattern of the second disconnection detecting signal layer; and wherein at least a part of the signal pattern is formed so as to be covered by the shield patter;

the data input and output contact; and a plurality of the contacts.

9. The medium processing device according to claim 8, wherein the flexible cable comprises:

a contact connection part which is connected with the data input and output contact and a plurality of the contacts; and a terminal covering part which is formed so as to be connected with the contact connection part and is folded so as to cover at least a connected portion of the data input and output contact with the contact connection part and is fixed to the contact connection part.

10. The medium processing device according to claim 9, wherein the first disconnection detecting signal layer and/or the second disconnection detecting signal layer are(is) formed with a first disconnection detecting signal pattern, which is the disconnection detecting signal pattern on an input side for the disconnection detecting signal, and a second disconnection detecting signal pattern which is the disconnection detecting signal pattern on an output side for the disconnection detecting signal, the contact connection part and the terminal covering part are formed with a land for connecting the first disconnection detecting signal pattern with the second disconnection detecting signal pattern, the terminal covering part is fixed to the contact connection part by soldering the land of the terminal covering part to the land of the contact connection part, and the first disconnection detecting signal pattern and the second disconnection detecting signal pattern are connected with each other by soldering the land of the terminal covering part to the land of the contact connection part.

11. The medium processing device according to claim 8, further comprising a connector with which the flexible cable is connected, wherein the disconnection detecting signal pattern is structured to detect detachment of the flexible cable from the connector.

\* \* \* \* \*